(12) United States Patent
Ishii et al.

(10) Patent No.: US 7,547,566 B2
(45) Date of Patent: Jun. 16, 2009

(54) ORGANIC ELECTROLUMINESCENT DEVICE AND METHOD OF MANUFACTURING THE SAME

(75) Inventors: Ryuji Ishii, Chino (JP); Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 131 days.

(21) Appl. No.: 11/357,123

(22) Filed: Feb. 21, 2006

(65) Prior Publication Data
US 2006/0141646 A1 Jun. 29, 2006

Related U.S. Application Data

(62) Division of application No. 10/860,105, filed on Jun. 4, 2004, now Pat. No. 7,112,823.

(30) Foreign Application Priority Data

Jun. 26, 2003 (JP) ............................. 2003-182961

(51) Int. Cl.
*H01L 21/00* (2006.01)

(52) U.S. Cl. .................... 438/29; 438/26; 438/28; 438/69; 438/82; 438/99; 257/80; 257/81; 257/82; 257/83; 257/E21.053; 257/E21.352; 313/504; 313/506; 313/509

(58) Field of Classification Search .................. 438/22, 438/23, 26, 28–29, 34, 69, 82, 99; 257/79, 257/80, 81, 82, 83, 84, E21.053, E21.352; 313/504, 506, 509
See application file for complete search history.

(56) References Cited

U.S. PATENT DOCUMENTS

| 6,208,076 | B1 * | 3/2001 | Arai et al. ................... 313/504 |
| 6,741,028 | B2 * | 5/2004 | Tanabe et al. ............... 313/509 |
| 2001/0031414 | A1 * | 10/2001 | Yoshida et al. ........... 430/108.3 |
| 2002/0031688 | A1 | 3/2002 | Tanabe et al. |
| 2003/0127969 | A1 * | 7/2003 | Aoki et al. .................. 313/503 |
| 2003/0173563 | A1 * | 9/2003 | Grizzi ......................... 257/40 |
| 2003/0230971 | A1 * | 12/2003 | Arakawa et al. ............ 313/503 |
| 2003/0235935 | A1 * | 12/2003 | Yamazaki et al. ............. 438/89 |
| 2004/0224182 | A1 | 11/2004 | Lazarev |

FOREIGN PATENT DOCUMENTS

| JP | A-9-293588 | 11/1997 |
| JP | A-10-134961 | 5/1998 |
| JP | A-2001-267082 | 9/2001 |
| JP | A-2002-151270 | 5/2002 |
| KR | A 2002-002278 | 1/2002 |

* cited by examiner

*Primary Examiner*—W. David Coleman
*Assistant Examiner*—Su C Kim
(74) *Attorney, Agent, or Firm*—Oliff & Berridge, PLC

(57) ABSTRACT

The invention provides an organic electroluminescent device and a method of manufacturing the same which conveniently reduce or suppress the transfer of ionic impurities into a light-emitting layer, and reduce or prevent the light-emitting property in the light-emitting layer from degrading, which promotes life extension. An organic electroluminescent device includes a functional layer having at least a light-emitting layer between a first electrode and a second electrode. At least a part of the functional layer is formed of the inorganic ion exchange material added to the functional material to form the functional layer.

5 Claims, 3 Drawing Sheets

ORGANIC ELECTROLUMINESCENT DEVICE AND METHOD OF MANUFACTURING THE SAME

This is a Divisional of application Ser. No. 10/860,105 filed Jun. 4, 2004. The entire disclosure of the prior application is hereby incorporated by reference herein in its entirety.

BACKGROUND OF THE INVENTION

1. Field of Invention

The present invention relates to an organic electroluminescent device and a method of manufacturing the same with an enhanced light-emitting property by selective trapping and fixation of mobile ions.

2. Description of Related Art

Related art organic electroluminescent elements (hereinafter "organic EL elements") using an organic substance in a light-emitting layer can be used as a spontaneous emission display. A significant issue with organic electroluminescent devices that have such organic electroluminescent elements is the life extension of the elements. Thus, a technology to promote the life extension of the elements is advantageous.

Accordingly, related art electroluminescent elements (organic electroluminescent devices), in which a device to apply a voltage in a direction opposite to the emitting electric field is provided in a device to apply a voltage between an anode and a cathode, is disclosed in Japanese Unexamined Patent Application Publication No. 9-293588, for example. The provision of such devices allows, for example, the orientation polarization of a functional group, which is a part of the organic compound composing the light-emitting layer when emitting, or the ionic polarization of ionic impurities, to be reduced or suppressed in advance by applying a voltage to the opposite direction before emitting light for the first time, and allows ionic impurities (mobile ions) to be prevented from being transferred and diffused into the light-emitting layer. As a result, the light-emitting property could be prevented from degrading or such degradation could be reduced in the light-emitting layer caused by the ionic impurities, and the life extension of the electroluminescent elements (organic electroluminescent devices) could be promoted.

SUMMARY OF THE INVENTION

However, the electroluminescent element (organic electroluminescent device) prevents the transfer of ionic impurities by its drive method, and prevents the light-emitting property from degrading in the light-emitting layer. Naturally, the drive system in such an electroluminescent element (organic electroluminescent device) becomes complicated, and eventually brings about a new issue, which may complicate the construction of the device.

The present invention addresses the above and/or other situations, and provides an organic electroluminescent device and a method of manufacturing the same which can conveniently reduce or prevent the ionic impurities from transferring into the light-emitting layer, and eventually reduce or prevent the light-emitting property from degrading in the light-emitting layer and promote life extension.

To address or achieve the above, the present invention provides an organic electroluminescent device including a functional layer having at least a light-emitting layer between a first electrode and a second electrode. At least a part of the functional layer is formed by using a functional material with an inorganic ion exchange material.

According to the organic electroluminescent device, at least a part of the functional layer is formed of an inorganic ion exchange material added to the functional material to form the functional layer. Thus, if ionic impurities are included in the functional layer with the addition of the inorganic ion exchange material, the ionic impurities can be prevented from diffusing, or such diffusion can be reduced, into the light-emitting layer by trapping and fixation onto the inorganic ion exchange material, and the degrading of the light-emitting property can be reduced or prevented. Also, when the ionic impurities included in each of the electrodes or other functional layers become mobile ions and diffuse, the trapping and fixation onto the inorganic ion exchange material will reduce or prevent the ionic impurities from diffusing in to the light-emitting layer.

Further, in the organic electroluminescent device, preferably, the functional layer has a carrier injection/transport layer, and the functional layer formed by adding the inorganic ion exchange material is a hole injection/transport layer functioning as the carrier injection/transport layer.

When done this way, the mobile ions (ionic impurities) existing in the material to form the hole injection/transport layer will be trapped and fixated onto the inorganic ion exchange material. Thus, the light-emitting property is prevented from degrading, or such degradation is reduced, in the light-emitting layer caused by the mobile ions.

Also, in this case, it is preferable that the inorganic ion exchange material be antimony pentoxide hydrate.

Antimony pentoxide hydrates have high selective absorption to Na ions. If the Na ions exist in the material to form the hole injection/transport layer, these Na ions can be satisfactorily trapped and fixated to prevent them from diffusing.

Further, in the organic electroluminescent device, the functional layer formed by adding the inorganic ion exchange material may be the light-emitting layer.

When done this way, even if the mobile ions (ionic impurities) diffuse into the light-emitting layer, they will be trapped and fixated by the inorganic ion exchange material. Thus, the light-emitting property is prevented from degrading, or such degradation is reduced, in the light-emitting layer caused by these mobile ions.

Further, in the organic electroluminescent device, the functional layer may have a carrier injection/transport layer, and the functional layer formed by adding the inorganic ion exchange material may be an electron injection/transport layer functioning as the carrier injection/transport layer.

When done this way, the mobile ions (ionic impurities) existing in the material to form the electron injection/transport layer will be trapped and fixated onto the inorganic ion exchange material. Thus, the light-emitting property is prevented from degrading, or such degradation is reduced, in the light-emitting layer caused by these mobile ions.

The present invention provides another organic electroluminescent device including a functional layer having at least a light-emitting layer between a first electrode and a second electrode, in which an inorganic ion exchange layer, formed of an inorganic ion exchange material, is provided between the first electrode and the second electrode.

According to the organic electroluminescent device, an inorganic ion exchange layer is provided between the first electrode and the second electrode. Thus, if ionic impurities included in each of the electrodes or functional layers, such as the hole injection/transport layer, become mobile ions and diffuse, they will be trapped and fixated by the inorganic ion exchange layer, preventing the light-emitting property from degrading, or reducing such degradation, caused by the ionic impurities diffusing into the light-emitting layer.

Further, in the organic electroluminescent device, it is preferable that the functional layer has a hole injection/transport layer between the first electrode and the light-emitting layer, and the inorganic ion exchange layer be provided between the hole injection/transport layer and the light-emitting layer.

When done this way, the mobile ions (ionic impurities) existing in the material to form the hole injection/transport layer will be trapped and fixated at the inorganic ion exchange layer. Thus, the light-emitting property is prevented from degrading, or such degradation is reduced, in the light-emitting layer caused by these mobile ions diffusing into the light-emitting layer.

Further, in the organic electroluminescent device, it is preferable that the functional layer has an electron injection/transport layer between the second electrode and the light-emitting layer, and the inorganic ion exchange layer be provided between the electron injection/transport layer and the light-emitting layer.

When done this way, the mobile ions (ionic impurities) existing in the material to form the electron injection/transport layer will be trapped and fixated at the inorganic ion exchange layer. Thus, the light-emitting property is prevented from degrading, or such degradation is reduced, in the light-emitting layer caused by these mobile ions diffusing into the light-emitting layer.

The present invention also provides a method of manufacturing an organic electroluminescent device that includes a functional layer having a light-emitting layer and a carrier injection/transport layer between a first electrode and a second electrode. The method includes: adding an inorganic ion exchange material to a functional material, and forming at least a part of the functional layer using the obtained functional material.

According to the method of manufacturing an organic electroluminescent device, at least a part of the functional layer is formed with the inorganic ion exchange material added to the functional material to form the functional layer. If ionic impurities are included in the functional layer with the addition of inorganic ion exchange material, they will be trapped and fixated onto the inorganic ion exchange material, thereby preventing the light-emitting property from degrading, or reducing such degradation, caused by the ionic impurities diffusing into the light-emitting layer. Also, when ionic impurities included in each of the electrodes or other functional layers become mobile ions and diffuse, they will be trapped and fixated onto the inorganic ion exchange material, preventing the light-emitting property from degrading, or reducing such degradation, caused by the ionic impurities diffusing into the light-emitting layer.

Further, in the method of manufacturing an organic electroluminescent device, it is preferable that the functional material with the addition of the inorganic ion exchange material be disposed by ejecting liquid droplets, to form the functional layer.

When done this way, it will be possible to precisely distribute the functional material with the addition of the inorganic ion exchange material at the desired location, and thus, for example, selectively distribute the inorganic ion exchange material corresponding to the light-emitting layer's color.

The present invention also provides another method of manufacturing an organic electroluminescent device that includes a functional layer having at least a light-emitting layer between a first electrode and a second electrode in which an inorganic ion exchange material is disposed between the first electrode and the second electrode to form an inorganic ion exchange layer.

According to the method of the manufacturing the inorganic electroluminescent device, an inorganic ion exchange layer is formed between the first electrode and the second electrode. Thus, when the ionic impurities included in each of the electrodes or the hole injection/transport layer become mobile ions and diffuse, they will be trapped and fixated at the inorganic ion exchange layer, preventing the light-emitting property from degrading, or reducing such degradation, caused by the ionic impurities diffusing into the light-emitting layer.

Furthermore, in the method of manufacturing the organic electroluminescent device, it is preferable that the inorganic ion exchange material be disposed by ejecting liquid droplets, to form the inorganic ion exchange layer.

When done this way, it will be possible to precisely distribute the inorganic ion exchange material at the desired location, and thus, for example, selectively distribute the inorganic ion exchange material corresponding to the light-emitting layer's color.

DETAILED DESCRIPTION OF PREFERRED EMBODIMENTS

Exemplary embodiments of the present invention are described in detail below.

First Exemplary Embodiment

Figure 1:
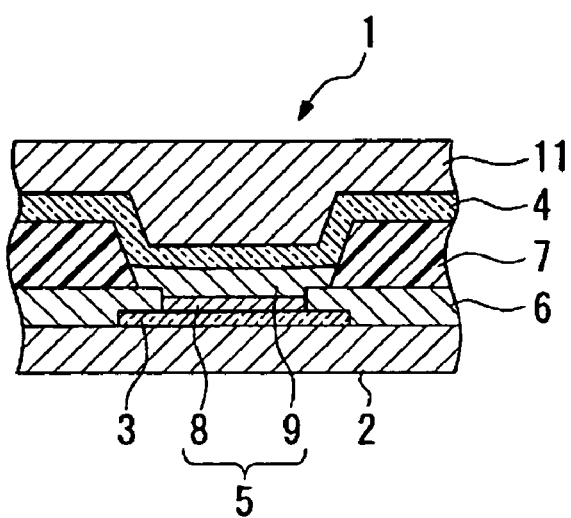
FIG. 1 is a sectional side view of significant parts of an organic electroluminescent device according to the present invention.

FIG. 1 is a sectional side view showing significant parts of an organic electroluminescent device according to a first exemplary embodiment of the present invention. FIG. 1 shows the organic electroluminescent device 1. The organic electroluminescent device 1 has a transparent electrode 3 (a first electrode) and a cathode 4 (a second electrode) on a substrate 2 thereof, and has a functional layer 5 between the transparent electrode 3 and the cathode 4, with the light emitted in the functional layer 5 being emitted from the substrate 2 side, which is referred to as a bottom emission type.

In the substrate 2, driving elements (not shown) composed of TFT elements, or various wiring lines, are formed on a transparent substrate, such as a glass substrate (not shown), and transparent electrodes 3 are formed on the corresponding driving elements or various wiring line via an insulating film or a flattening film.

The transparent electrodes 3 are patterned in corresponding single dot areas to be formed on the substrate 2, and are respectively connected to the driving elements composed of TFT elements, or various wiring lines. In the present invention, the transparent electrodes are formed of indium tin oxide (ITO).

An inorganic bank 6 and an organic bank 7 are formed around the transparent electrode 3 to define a single dot area, and the functional layer 5 is provided in a concave portion surrounded by the inorganic bank 6 and the organic bank 7.

Particularly, in the dot area that emits red or green light, the functional layer 5 includes a hole injection/transport layer 8 and a light-emitting layer 9, as shown in FIG. 1. Further, in the dot area that emits green light, an electron injection/transport layer (not shown) is provided on the light-emitting layer 9 in addition to the hole injection/transport layer 8 and the light-emitting layer 9.

The hole injection/transport layer 8 is formed of a material obtained by adding an inorganic ion exchange material to an original material to form the hole injection/transport layer.

In other words, as the original material to form the hole injection/transport layer, a dispersion solution of 3,4-polyethylenedioxythiophene/polystylene sulfonic acid (PEDOT/PSS) [Brand name: "Bytron-p" made by Bayer AG], i.e., a dispersion solution which is obtained by dispersing 3,4-polyethylenedioxythiophene in polystyrene sulfonic acid as the dispersion medium, and dispersing the resultant again in water may be adequately used. Here, Na ions as ionic impurities with a concentration close to hundreds of ppm is contained in this formation material, and the Na ions may diffuse as mobile ions.

Accordingly, in the present exemplary embodiment, a dispersion solution, which is obtained by adding an inorganic ion exchange material to such material, is used.

The inorganic ion exchange material is composed of metal salt, such as metallic oxide, and includes the type that adsorbs positive ions to trap and fixate these ions, the type that adsorbs negative ions to trap and fixate these ions, and the type that adsorbs both the positive and negative ions to trap and fixate these ions.

The inorganic ion exchange material to trap and fixate positive ions may include antimony pentoxide ($Sb_2O_5$) hydrates (for example, IXE [registered trademark]-300 made by Toagosei. Co., Ltd.)), titanium phosphate (for example, IXE [registered trademark]-400 made by Toagosei. Co., Ltd.), or zirconium phosphate (for example, IXE [registered trademark]-100 made by Toagosei. Co., Ltd.). Antimony pentoxide hydrates especially have a high selective absorption to Na ions and are thus suitable as an inorganic ion exchange material added to the original material to form the hole injection/transport layer. The reason for this is that many Na ions are included as the ionic impurities in the original material to form the hole injection/transport layer as previously described, and they become mobile ions which may degrade the light-emitting property in the light-emitting layer 9.

Further, the inorganic ion exchange material to trap and fixate negative ions may include the hydrous bismuth oxide (for example, IXE [registered trademark]-500 made by Toagosei. Co., Ltd.), or lead phosphate hydroxide (for example, IXE [registered trademark]-1000 made by Toagosei. Co., Ltd.). Since hydrous bismuth oxide especially have a high selective absorption to sulphate ($SO_4^{-2}$) ions, it is suitably used as an inorganic ion exchange material added to the original material to form the hole injection/transport layer together with the aforementioned antimony pentoxide hydrates. In other words, the original material to form the hole injection/transport layer uses polystyrene sulfonic acid as the dispersion medium. Thus, when Na ions are trapped and fixated in the antimony pentoxide hydrates, free sulphate ions increase and the free sulphate ions become mobile ions and diffuse, which may degrade the light-emitting property of the light-emitting layer 9. Therefore, by adding the aforementioned hydrous bismuth oxide, the free sulphate ions are trapped and fixated, making it possible to prevent the degrading of the light-emitting property of the light-emitting layer 9 or reducing such degradation.

The inorganic ion exchange material to adsorb both positive and negative ions to trap and fixate these ions may include zirconium oxide or hydrous zirconium oxide, hydrous titanium oxide, and furthermore, substances in the antimony or bismuth system (for example, IXE [registered trademark]-600 or IXE [registered trademark]-633), which is made by Toagosei. Co., Ltd.). When using such type, a simultaneous trapping and fixation of both the Na ions included in the original material to form the hole injection/transport layer and the free sulphate ions can be expected.

Also, in the present exemplary embodiment, antimony pentoxide hydrates are used as an inorganic ion exchange material, and is added to the original material to from the hole injection/transport layer, thereby forming a hole injection/transport layer 8.

As the material to form the light-emitting layer 9, a related art or known material capable of emitting fluorescent light or phosphorescence is used. In the present exemplary embodiment, particularly, the luminous wavelength bands corresponding to the three primary colors of light are used to achieve full color display. That is, three light-emitting layers (dots) including a light-emitting layer corresponding to red, a light-emitting layer corresponding to green, and a light-emitting layer corresponding to blue, constitute a pixel. The light-emitting layers emit light with grayscales, so that the organic electroluminescent device 1 can perform a full color display.

As the specific material to form the light-emitting layer 9, polymeric materials, such as the polysilane system including (poly)-fluorene (PF) derivatives, (poly)-paraphenylenevinylene (PPV) derivatives, polyphenylene (PP) derivatives, polyparaphenylene (PPP) derivatives, polyvinylcarbazole (PVK) derivatives, polythiophene derivatives and polymethyl phenylsilane (PMPS) derivatives are suitably used.

Further, materials obtained by doping the above-mentioned polymeric materials with polymeric materials, such as perylene based pigments, coumarin pigments and rhodamine pigments, or low molecular materials, such as rubrene, perylene, 9,10-diphenylanthracene, tetraphenylbutadiene, Nile red, coumarin 6, quinacridon can also be used.

The cathode 4 is formed to cover the entire pixel area, and is formed by sequentially laminating a Ca layer and an Al layer from the light-emitting layer 9 side.

Further, a sealing layer 11 is formed on the cathode 4. The sealing layer 11 can have a known construction that is formed by a protective layer, an adhesive layer and a sealed substrate.

In order to manufacture the organic electroluminescent device 1 having such a construction, TFTs or various wiring lines is first formed on a transparent substrate in the same way as in a related art or the conventional manner, and an interlayer insulating film or a flattening film is then formed, thereby obtaining the substrate 2.

Next, an ITO film is formed on the substrate 2 by a vapor deposition method, and a transparent electrode 3 is formed by patterning.

Figure 2:
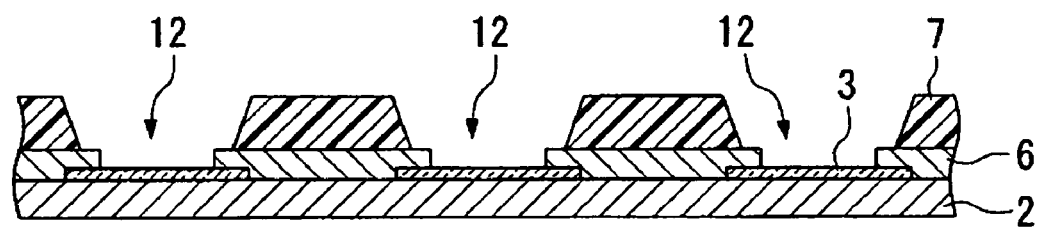
FIG. 2 is a schematic explaining a method of manufacturing the organic electroluminescent device.

Subsequently, an inorganic bank 6 formed of SiO2 is formed on the substrate 2 so as to surround the transparent electrode 3, and an organic bank 7 formed of resin is also formed on the inorganic bank 6, so that a concave portion 12 is formed in the transparent electrode 3, as shown in FIG. 2. Materials used for the organic bank 7 may include polyimide or acrylic resin. Materials in which elemental fluorine is included in those materials in advance may also be used.

Next, as shown in FIG. 2, the wettability on the substrate in which the concave portion 12 is surrounded by the inorganic bank 6 and the organic bank 7 is controlled by the consecutive plasma treatment of oxygen plasma-CF4, and a hole injection/transport layer 8 is formed inside the concave portion 12 by a liquid droplet ejection method, such as an ink jet method. Here, an inorganic ion exchange material (antimony pentoxide hydrates) added to the original material to form the hole injection/transport layer as previously described, is used to form the hole injection/transport layer 8. However, this inorganic ion exchange material is powdered. If the grain size is not small enough, a liquid droplet ejection head (an ink jet head) may get stuck. Thus, it is preferred that the grain size be adjusted under a predetermined value and then be used.

Specifically, for example, antimony pentoxide hydrate (IXE [registered trademark]-300 made by Toagosei. Co., Ltd.) is added to the original material (a dispersion solution of PEDOT/PSS) to form the hole injection/transport layer until it reaches 1 percent by weight, and is agitated for a predetermined period of time (for instance, 18 hours). Then, the obtained liquid is filtered through a filter with a mesh size of 1.0 μm. Subsequently, the obtained filtrate is filtered again, through a filter with a mesh size of 0.5 μm, whereby the powders with diameters over 0.5 μm are removed from the material.

Figure 3A:
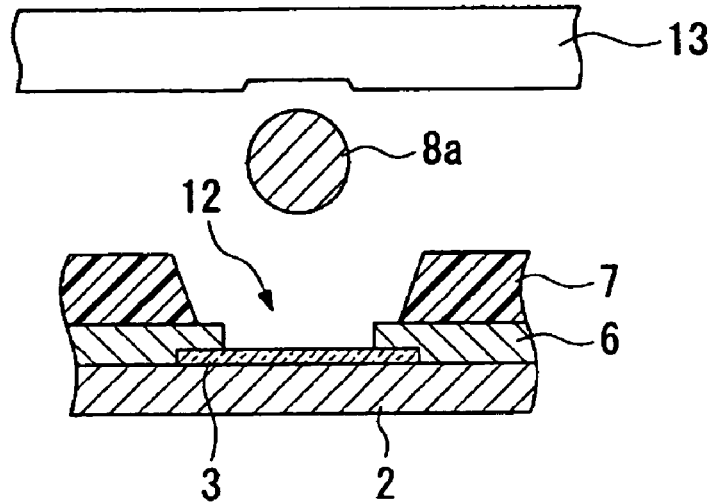
FIGS. 3A-3C are schematics of the processes subsequent to the process shown in FIG. 2.
Figure 3B:
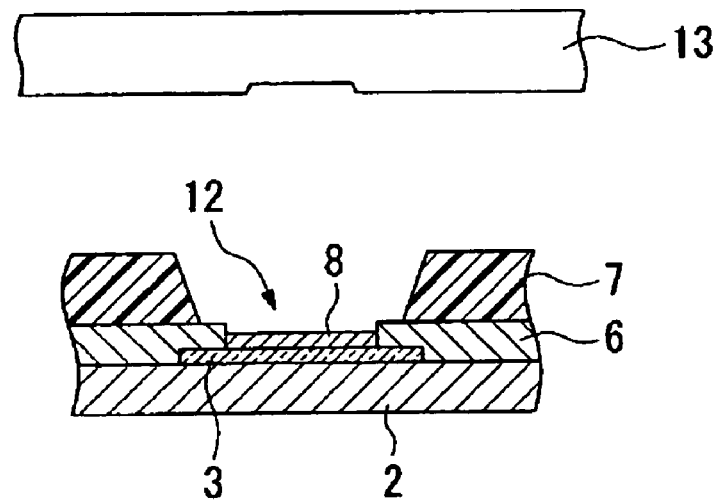

With the material made through this process, this material is selectively ejected as liquid droplets 8a into the concave portion 12 from a liquid droplet ejection head (ink jet head) 13, as shown in FIG. 3A, and when this is continued, a hole injection/transport layer 8 is formed on the transparent electrode 3, as shown in FIG. 3B.

Figure 3C:
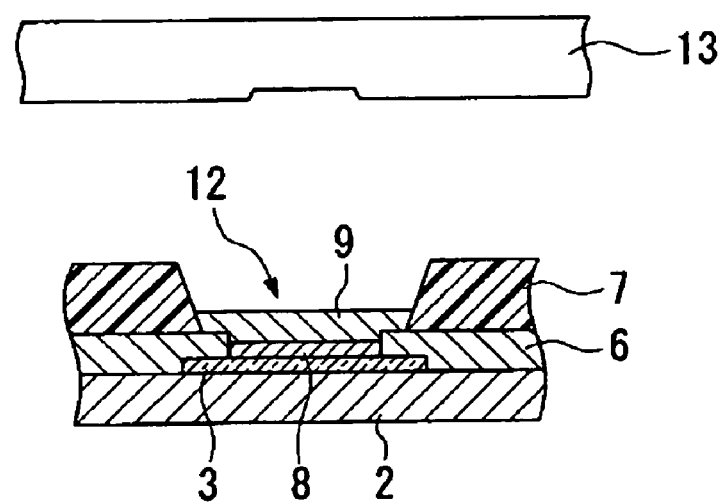

Next, as shown in FIG. 3C, a light-emitting layer 9 is formed on the hole injection/transport layer 8 within the concave portion 12. The liquid droplet ejection method (ink jet method) is also suitably adopted to form the light-emitting layer 9. In other words, when forming the light-emitting layer 9, each of the light-emitting layers for red, green and blue must be made independently, but according to the liquid droplet ejection method, the formation material for each of the light-emitting layers is separately implanted simply at the desired location, which makes it possible to easily form each of the light-emitting layers.

Next, a Ca film is formed with the light-emitting layer 9 and the organic bank 7 being covered therewith by a vapor deposition method in the same way as in the related art or conventional manner, and an Al film is formed on the Ca film, thereby forming a cathode 4 of a Ca/Al layered structure. Particularly, in the case of the blue light-emitting layer, an electron injection/transport layer may be formed using a mask with the selective vapor deposition of LiF on the blue light-emitting layer, but this is not described in detail below.

Thereafter, a protective layer and an adhesive layer are formed on the cathode 4, and further by adhering a sealed substrate, an organic electroluminescent device 1 shown in FIG. 1 can be attained.

In the organic electroluminescent device 1 obtained as described above, an inorganic ion exchange material is added to the hole injection/transport layer 8 to form it. Thus, mobile ions, such as Na ions or sulphate ions in the material to form the hole injection/transport layer, will be trapped and fixated by the inorganic ion exchange material and will be kept confined inside the hole injection/transport layer 8, thereby preventing the mobile ions from diffusing, or reducing such diffusion, into the light-emitting layer 9 and shortening the lifespan, as a result of that the life extension can be attained.

Further, by trapping and fixating the Na ions by the inorganic ion exchange material and keeping the Na ions confined inside the hole injection/transport layer 8, the Na ions can be prevented from diffusing, or such diffusion can be reduced, into the TFT element side of the substrate 2, and characteristics of the TFT element can be prevented from being damaged or such damage can be reduced.

Moreover, for example, even when the In ions or Sn ions in the transparent electrode 3 diffuses, they can be trapped and fixated in the hole injection/transport layer 31 with the inorganic ion exchange material and can be prevented from diffusing, or such diffusion can be reduced, into the light-emitting layer 9. As a result, the degrading of the light-emitting property, i.e., shortening of the lifespan can be reduced or prevented.

Experimental Example

A transparent electrode formed of ITO is formed on a substrate 2, and on the transparent electrode, a material (a material obtained from filtering twice and adjusting the diameter of the inorganic ion exchange material) used to form a hole injection/transport layer 8 is used to form a film by a spin coating method, thereby forming a hole injection/transport layer.

Next, a light-emitting material that emits green color light is applied on the hole injection/transport layer by a liquid droplet ejection method, thereby forming a light-emitting layer.

Thereafter, a Ca film and an Al film are respectively formed on the light-emitting layer in this order by a vapor deposition method to form a cathode composed of a Ca/Al layered structure, and after sealing, the experimental example of the organic electroluminescent device according to the present invention is attained.

For comparison, a hole injection/transport layer formed of the original material without the addition of an inorganic ion exchange material was formed, and the rest is manufactured in the same way as in the exemplary embodiment, so that the organic electroluminescent device as a comparative example was attained.

After measuring the lifespan of each of these organic electroluminescent devices formed as previously described, the exemplary embodiment had a lifespan 1.6 times longer than the comparative example, and it could be confirmed that, by adding the inorganic ion exchange material, the life extension of light-emitting elements can be accomplished.

Further, the lifespan measured here was the period of time for the luminance to drop to half of its initial value. Also, the results of the increase in a drive voltage measured until the luminance dropped down to its half showed that the exemplary embodiment was suppressed by 0.68 times from the experimental example.

Second Exemplary Embodiment

Figure 4:
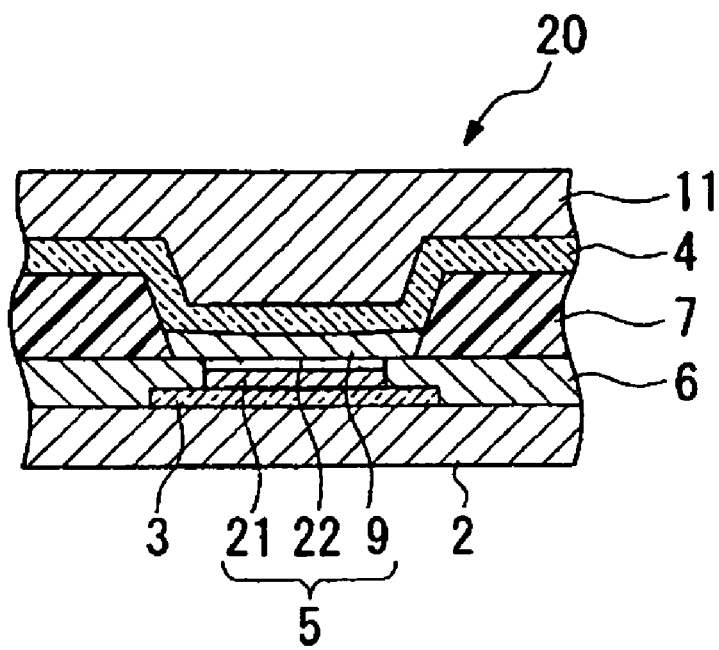
FIG. 4 is a sectional side view of significant parts of another organic electroluminescent device according to the present invention.

FIG. 4 is a sectional side view showing significant parts of an organic electroluminescent device according to a second exemplary embodiment of the present invention. FIG. 4 shows the organic electroluminescent device 20. A significant difference between the organic electroluminescent device 20 shown in FIG. 4 and the organic electroluminescent device 1 shown in FIG. 1 is that, in the organic electroluminescent device 20 shown in FIG. 4, an inorganic ion exchange layer 22 is formed between a hole injection/transport layer 21 and a light-emitting layer 9.

In other words, in the organic electroluminescent device 20 shown in FIG. 4, the hole injection/transport layer 21 is formed with only the original material to form the hole injection/transport layer, somewhat different from the hole injection/transport layer 8 shown in FIG. 1. Accordingly, the hole injection/transport layer 21 formed of the original material to form the hole injection/transport layer will contain many Na ions as its ionic impurities as described above, and from this, these Na ions easily diffuse as mobile ions.

However, in the present exemplary embodiment, the inorganic ion exchange layer 22 is formed between the hole injection/transport layer 21 and the light-emitting layer 9. The inorganic ion exchange layer 22 is formed of the inorganic ion exchange material as mentioned above, and for instance, is formed by mixing this inorganic ion exchange material with conductive resin, arranging the mixed inorganic ion exchange material on the hole injection/transport layer 21 by a liquid droplet ejection method, thereby forming a film. Depending on the types of the inorganic ion exchange material, the vapor deposition method can be used to form a film.

The light-emitting layer 9 is formed on the inorganic ion exchange layer 22, and further a cathode 4 is formed on the light-emitting layer 9. Further, in the same manner as in the first exemplary embodiment, an electron injection/transport layer (not shown) is formed on the blue light-emitting layer. Moreover, a sealing layer 11 is formed on the cathode 4, thereby forming the organic electroluminescent device 20.

In the organic electroluminescent device 20 having the above construction, the inorganic ion exchange layer 22 is provided between the hole injection/transport layer 21 and the light-emitting layer 9. Thus, when the Na ions that are ionic impurities existing, especially, in the hole injection/transport layer 21 become mobile ions and diffuse, they can be trapped and fixated by the inorganic ion exchange layer 22. Accordingly, the light-emitting property can be prevented from degrading, or such degradation can be reduced, due to the diffusion of Na ions into light-emitting layer 9, for example, the lifespan can be prevented from shortening or such shortening can be reduced.

Further, for example, even when Sn ions in the transparent electrode 3 diffuse, these ions will be trapped and fixated and be prevented from diffusing, or such diffusion can be reduced, into the light-emitting layer 9 and degrading the light-emitting property.

Third Exemplary Embodiment

Figure 5:
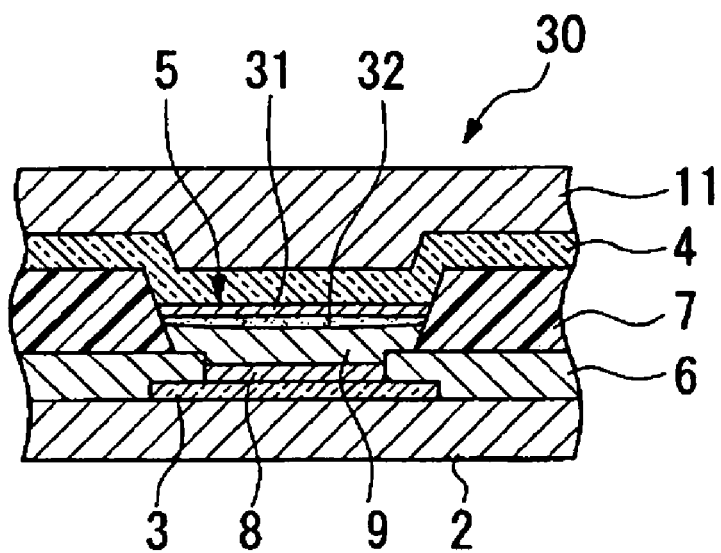
FIG. 5 is a sectional side view of significant parts of still another organic electroluminescent device according to the present invention.

FIG. 5 is a sectional side view showing significant parts of an organic electroluminescent device according to a third exemplary embodiment of the present invention. FIG. 5 shows the organic electroluminescent device 30. A significant difference between the organic electroluminescent device 30 shown in FIG. 5 and the organic electroluminescent device 20 shown in FIG. 4 is that, in the organic electroluminescent device 30 shown in FIG. 5, an inorganic ion exchange layer 32 is formed between a light-emitting layer 9 and an electron injection/transport layer 31.

The inorganic ion exchange layer 32 is formed of the inorganic ion exchange material described in the first exemplary embodiment, similar to the inorganic ion exchange layer 22 shown in FIG. 4. In other words, for example, the inorganic ion exchange layer is formed by mixing this inorganic ion exchange material with conductive resin, and arranging the mixed inorganic ion exchange material on a hole injection/transport layer 21 by a liquid droplet ejection method. Depending on types of the inorganic ion exchange material, the vapor deposition method can also be used to form a film.

An electron injection/transport layer 31 is provided when the blue light-emitting layer is formed of, especially, a polymeric material, and is formed from the selective vapor deposition of LiF onto the light-emitting layer (blue light-emitting layer) 9 with a mask. The electron injection/transport layer 31 formed of LiF is for efficient injection/transport of electrons from the cathode 4 of Ca/Al formed thereon to the light-emitting layer 9.

Further, if the electron injection/transport layer 31 comes in direct contact with the light-emitting layer 9 in the same way as in the related art or conventional manner, the Li ions in the electron injection/transport layer 31 will become mobile ions and diffuse into the light-emitting layer 9. Then, while these Li ions stay in the surface of the light-emitting layer 9, i.e., the interface with the electron injection/transport layer 31, they will function to attract the electrons from the cathode 4 to the light-emitting layer 9, and this will improve the injection property/transportability of electrons.

However, as some time elapses, the Li ions will diffuse into the center of the light-emitting layer 9, and the function to attract electrons will diminish, whereas the light-emitting efficiency of the light-emitting layer 9 or the luminance thereof will degrade, eventually shortening the lifespan.

Therefore, in the present exemplary embodiment, the inorganic ion exchange layer 32 is formed between the light-emitting layer 9 and the electron injection/transport layer 31 as described above. From this formation of the inorganic ion exchange layer 32, the Li ions from the electron injection/transport layer 31 will be trapped and fixated in the inorganic ion exchange layer 32, and this allows the light-emitting property to be prevented from degrading, or such degradation can be reduced, due to diffusion of the Li ions into the light-emitting layer 9, for example or the lifespan to be prevented from shortening or such shortening can be reduced. Also, even when the Ca ions in the cathode 4 diffuse, they can be trapped and fixated and be prevented from diffusing, or such diffusion can be reduced, into the light-emitting layer 9, thereby preventing or reducing degrading of the light-emitting property.

In the present exemplary embodiment, it is also preferred that the inorganic ion exchange layer 32 be formed by the liquid droplet ejection method (ink jet method). By adopting the liquid droplet ejection method, the inorganic ion exchange material can be selectively or precisely disposed only on the blue light-emitting layer. Accordingly, reliability, such as the lifespan characteristics in the blue light-emitting layer, can be satisfactorily secured. Also, when adopting the liquid droplet ejection method, it can be conducted by mixing the inorganic ion exchange material with conductive resin, and dissolving it in a suitable solvent or dispersing in a suitable dispersion medium.

In the organic electroluminescent device 30 having the above construction, the inorganic ion exchange layer 32 is formed between the light-emitting layer 9 and the electron injection/transport layer 31. Thus, the Li ions from the electron injection/transport layer 31 will be trapped and fixated in the inorganic ion exchange layer 32, which will prevent or reduce the Li ions from diffusing into the light-emitting layer 9 and degrading the light-emitting property, and for instance, shortening the lifespan. Even when the Ca ions in the cathode 4 diffuse, they will be trapped and be prevented from diffusing, or such diffusion can be reduced, into the light-emitting layer 9, and degrading the light-emitting property can be reduced or prevented.

The present invention is not limited to the first, second and third exemplary embodiments, and various alterations can be made as long as they do not depart from the scope of the present invention.

For example, the hole injection/transport layer 8 as the carrier injection/transport layer was formed by adding an inorganic ion exchange material in the first exemplary embodiment, but when forming an electron injection/transport layer with a polymeric material, the metallic ion-trapping materials mentioned above may be added to the material to form the electron injection/transport layer.

When done this way, by trapping and fixating the metallic ions (ionic impurities) from the cathode 4 or the metallic ions (ionic impurities) existing in the electron injection/transport layer by an inorganic ion exchange material to confine the ions in an electron injection/transport layer, the diffusion of these metallic ions (ionic impurities) into the light-emitting layer 9 which degrades the light-emitting property, such as the lifespan, can be reduced or prevented.

Also, the inorganic ion exchange material may be directly added to the material to form the light-emitting layer and this may be used to form the light-emitting layer. Then, even if the metallic ions diffuse from the hole injection/transport layer which is the carrier injection/transport layer or the electron injection/transport layer, and further from the transparent electrode 3 or the cathode 4, they can be trapped and fixated by the inorganic ion exchange material, making it possible to reduce or prevent the light-emitting property from degrading due to the metallic ions.

Further, in the second and third exemplary embodiments, the inorganic ion exchange layer 22 (32) was provided only either between the hole injection/transport layer 21 and the light-emitting layer 9 or between the light-emitting layer 9 and the electron injection/transport layer 31. However, the inorganic ion exchange layer 22 and the inorganic ion exchange layer 32 may be provided on both sides.

Further, in the above exemplary embodiments, a polymeric material is used as the material to form the light-emitting layer 9, but a low molecular material may also be used to form the light-emitting layer 9. In that case, it is preferred that the electron injection/transport layer is provided in all of the light-emitting layers, not just on the blue light-emitting layer, and that an inorganic ion exchange layer is provided between every light-emitting layer and electron injection/transport layer.

Moreover, the exemplary embodiments have described about applying the present invention to a bottom emission type organic electroluminescent device, but the present invention is not limited to this type, and can also be applied to a so-called top emission type organic electroluminescent device, where light is emitted from the opposite side of the substrate.

The organic electroluminescent device of the present invention as previously described can be suitably used as a display for portable information processors, such as word processors and personal computers, or electronic apparatuses, such as portable phones and wristwatch-type electronics, for example.

What is claimed is:

1. A method of manufacturing an organic EL device that includes a functional layer having a light-emitting layer and a carrier injection/transport layer between a first electrode and a second electrode, the method comprising:

forming the carrier injection/transport layer by ejecting liquid droplets of a dispersion liquid including a carrier injection/transport layer formation material and an inorganic ion exchange material, the carrier injection/transport layer formation material being PEDOT/PSS and the inorganic ion exchange material including one of zirconium oxide, hydrous titanium oxide, antimony or bismuth; and forming the light-emitting layer on the carrier injection/transport layer.

2. The method of manufacturing an organic EL device as set forth in claim 1, the step of forming the carrier injection/transport layer comprising:

adding the inorganic ion exchange material to the dispersion liquid including the carrier injection/transport layer;

filtering the liquid droplets through a filter, such that a grain diameter of the inorganic ion exchange material included in the liquid droplets obtained by adding the inorganic ion exchange material to the dispersion liquid including the carrier injection/transport layer is a predetermined value or less; and ejecting the liquid droplets which have been filtered onto the first electrode by an inkjet method.

3. A method of manufacturing an organic EL device that includes a functional layer having a light-emitting layer and a carrier injection/transport layer between a first electrode and a second electrode, the method comprising:

forming the carrier injection/transport layer by ejecting liquid droplets of a dispersion liquid including a carrier injection/transport layer formation material and an inorganic ion exchange material, the carrier injection/transport layer formation material being PEDOT/PSS and the inorganic ion exchange material including one of hydrous bismuth oxide or lead phosphate hydroxide; and forming the light-emitting layer on the carrier injection/transport layer.

4. The method of manufacturing an organic EL device as set forth in claim 3, the inorganic ion exchange material further including one of antimony pentoxide hydrate, titanium phosphate, or zirconium phosphate.

5. The method of manufacturing an organic EL device as set forth in claim 3, the step of forming the carrier injection/transport layer comprising:

adding the inorganic ion exchange material to the dispersion liquid including the carrier injection/transport layer;

filtering the liquid droplets through a filter, such that a grain diameter of the inorganic ion exchange material included in the liquid droplets obtained by adding the inorganic ion exchange material to the dispersion liquid including the carrier injection/transport layer is a predetermined value or less; and ejecting the liquid droplets which have been filtered onto the first electrode by an inkjet method.

* * * * *